United States Patent [19]

Suzuki

[11] 4,242,599
[45] Dec. 30, 1980

[54] CHARGE TRANSFER IMAGE SENSOR WITH ANTIBLOOMING AND EXPOSURE CONTROL

[75] Inventor: Nobuo Suzuki, Kamakura, Japan

[73] Assignee: Tokyo Shibaura Denki Kabushiki Kaisha, Kawasaki, Japan

[21] Appl. No.: 7,173

[22] Filed: Jan. 29, 1979

[30] Foreign Application Priority Data

Feb. 22, 1978 [JP] Japan .................................. 53-18542

[51] Int. Cl.³ ...................... H03K 3/42; G11C 19/28; H01L 29/78; H01L 27/14
[52] U.S. Cl. ............................. 307/311; 307/221 D; 357/24; 357/30
[58] Field of Search ............... 357/24, 30; 307/221 D, 307/311

[56] References Cited

U.S. PATENT DOCUMENTS 3,845,295 10/1974 Williams et al. ....................... 357/24
3,904,818 9/1975 Kovac .................................... 357/24

OTHER PUBLICATIONS

White et al., "A Multiple-Gate CCD-Photodiode Sensor Element . . . ", IEEE J. Solid-State circuits, vol. SC-13 (2/78), pp. 51-57.

Primary Examiner—Gene M. Munson
Attorney, Agent, or Firm—Oblon, Fisher, Spivak, McClelland & Maier

[57] ABSTRACT

A charge transfer image sensor comprises a signal-readout section, overflow drain section, overflow gate electrodes, photosensing regions and transfer gate electrodes. A first barrier gate electrode is formed between each photosensing region and the overflow drain section and a second barrier gate electrode is provided between each photosensing region and the signal-readout section. During the operation of the image sensor, a prescribed amount of invariable charge is always stored in the photosensing region. One charge-integration period is divided into first and stored integration subperiods. A first variable charge stored in the photosensing region and the semiconductor regions under the first and second barrier gate electrodes during the first integration subperiod is drawn off to the overflow drain section through the semiconductor region under the overflow gate electrode. A second variable charge stored in the photosensing region and the semiconductor region under the first and second barrier gate electrode is transferred to the signal-readout section through the semiconductor region under the transfer gate electrode.

9 Claims, 22 Drawing Figures

FIG. 1
PRIOR ART
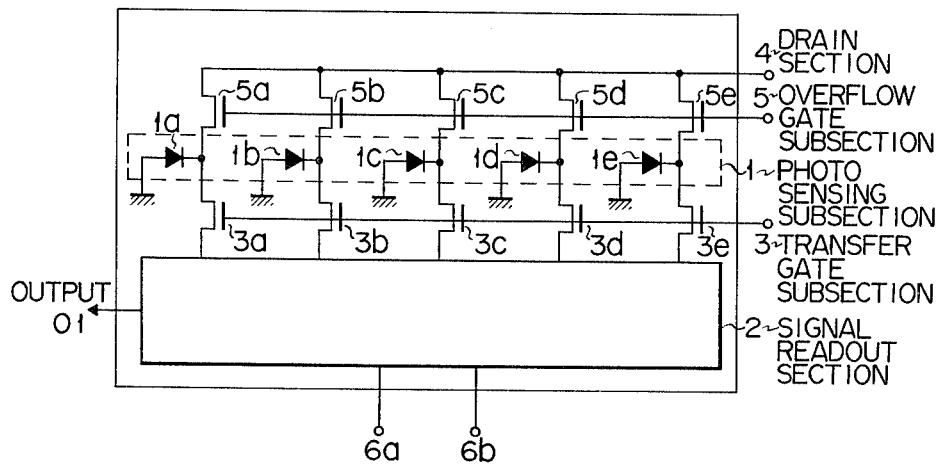
FIG. 2
PRIOR ART
FIG. 2A
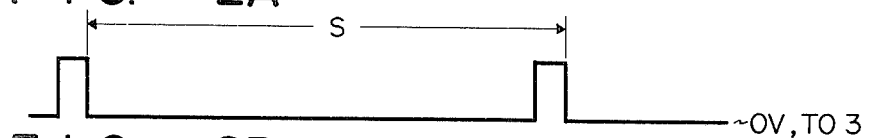
FIG. 2B
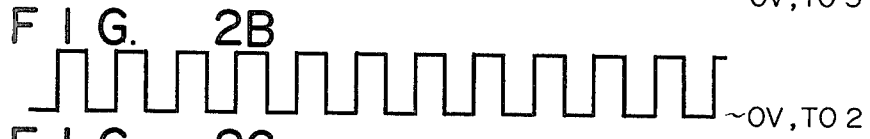
FIG. 2C
FIG. 2D
FIG. 2E
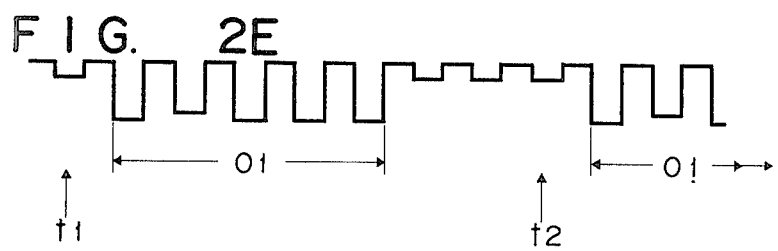

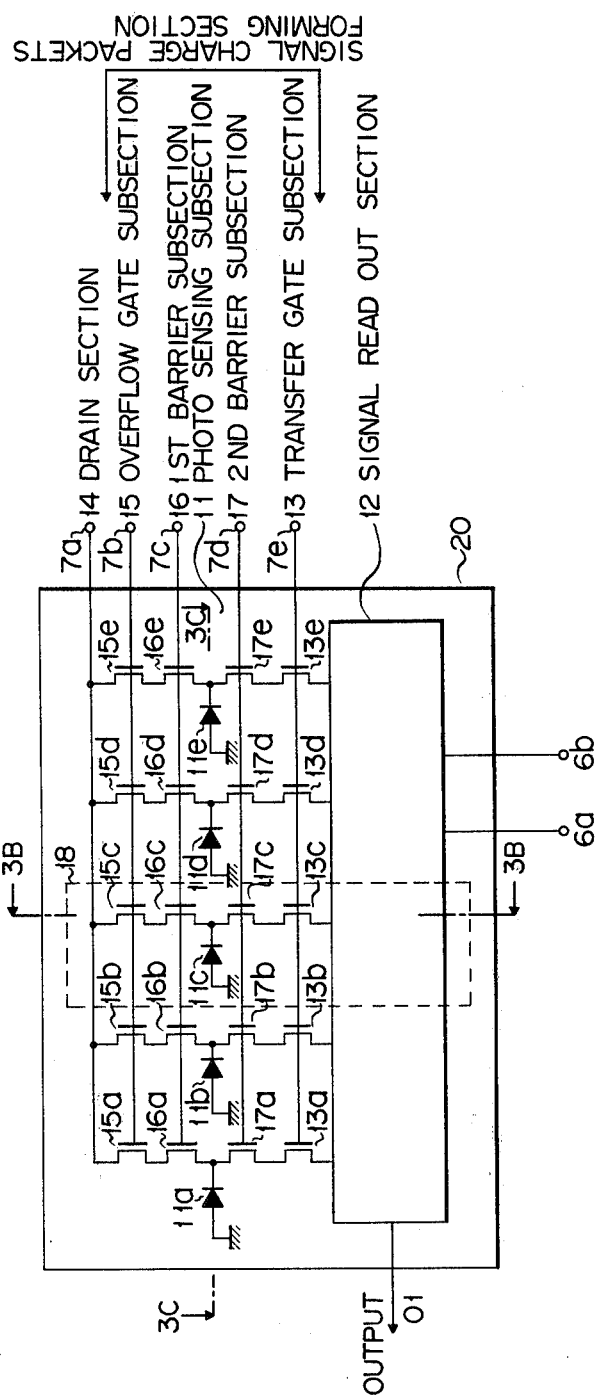

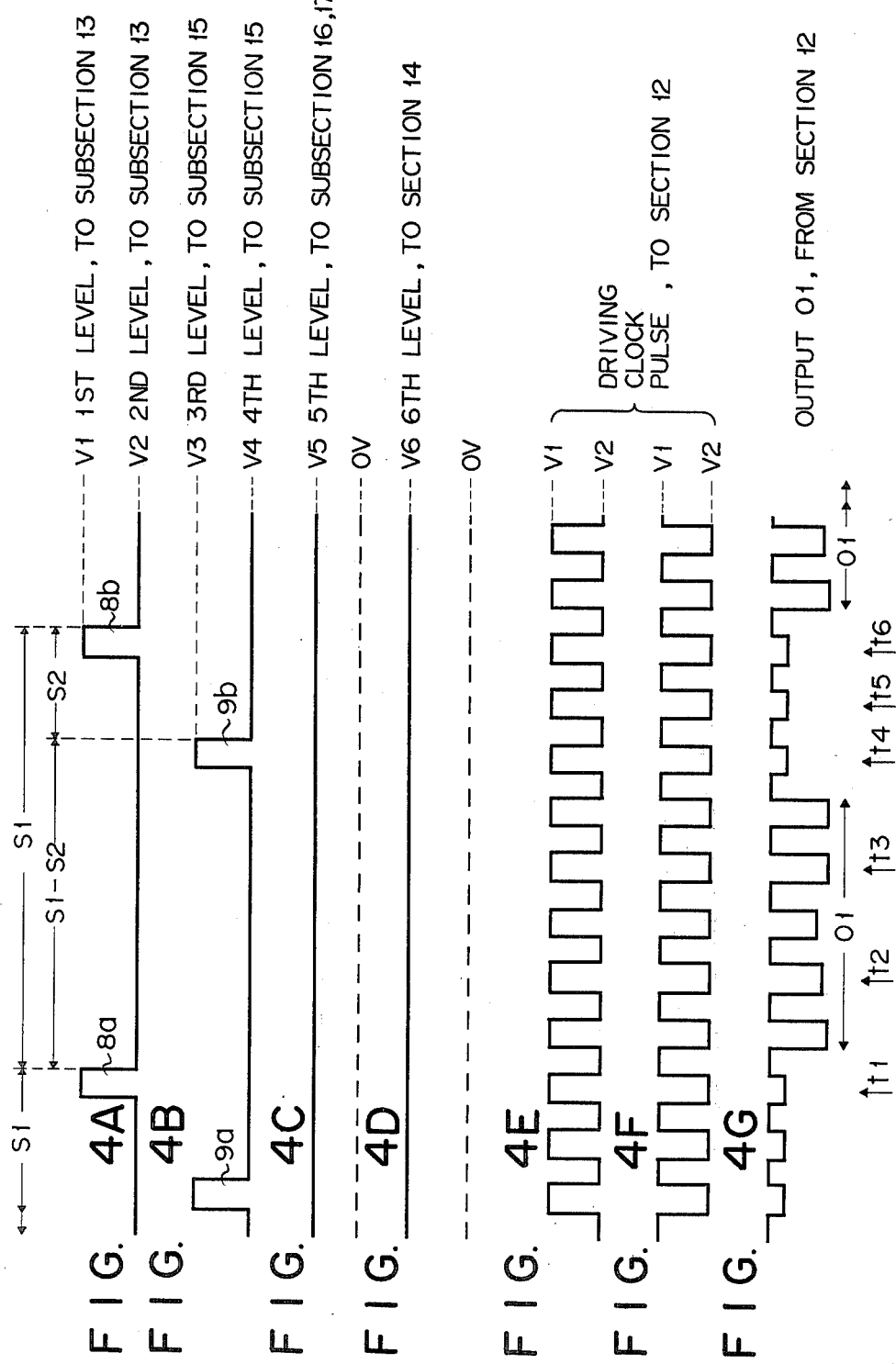

CHARGE TRANSFER IMAGE SENSOR WITH ANTIBLOOMING AND EXPOSURE CONTROL

BACKGROUND OF THE INVENTION

This invention relates to a charge transfer image sensor and more particularly to an image sensor which can produce a video signal having a good picture quality even when very intense light beams are received from a foreground subject.

Generally, an image sensor comprises a photosensing subsection, which is provided with a plurality of photosensing regions. A charge packet stored in the photosensing region constitutes a picture element. Where a bright incoming light beam happens to produce too large an electric charge to be stored in a photosensing region, then such excess electric charge flows into an adjacent photosensing region or into a shift register designed to read out an output from an adjacent sensing region or charge packet, thus preventing said shift register from sensing forth a good video signal. Such event is known as the blooming phenomenon. An image sensor arranged as shown in FIG. 1 is already known as means for suppressing the blooming phenomenon. For briefness of description, FIG. 1 indicates an image sensor constituting five picture elements. A photosensing subsection 1 consists of a plurality of photodiodes 1a to 1e, each converting a photosignal into a signal charge and storing the signal charge. Signal charges stored in the photodiodes 1a to 1e are transferred to a signal-readout section 2 (such as a shift register) of, for example, a 2-phase driving type through a signal charge packet transfer gate subsection 3 comprising five signal charge transfer regions provided with electrodes 3a to 3e respectively. The signal-readout section 2 sends forth an output signal $O_1$ (video signal). The aforesaid excess charges are conducted to an overflow drain-section 4 through an overflow gate subsection 5 comprising five overflow gate regions provided with electrodes 5a to 5e respectively to be drawn off to the outside. The overflow drain-section 4, signal-readout section 2, overflow gate subsection 5, photosensing subsection 1 and transfer gate subsection 3 are all integrated on, for example, a P-type semiconductor substrate.

FIGS. 2A to 2D show the waveforms of signals supplied to the respective sections and subsections of FIG. 1. FIG. 2E indicates the waveform of an output signal $O_1$ from the signal-readout section 2 (for example, a shift register). The electrodes 3a to 3e of the respective regions of the signal charge transfer gate subsection 3 are supplied with a signal charge transfer pulse of FIG. 2A at an interval S of integration time, (a total integration period during which light beams are received). The terminals 6a, 6b of the signal-readout section 2 are supplied with clock pulses of FIGS. 2B and 2C. The electrodes 5a to 5e of the overflow gate subsection 5 are impressed with a D.C. voltage of FIG. 2D. FIG. 2E shows the waveform of an output signal $O_1$ from the signal-readout section 2 which is produced during one scanning period thereof.

At time $t_1$, the electrodes 3a to 3e are supplied with a signal charge transfer pulse of FIG. 2A. Before the time $t_1$, signal charges stored in the photodiodes 1a to 1e are delivered to the signal-readout section 2. When scanned, this section produces an output signal $O_1$ of FIG. 2E. After the time $t_1$, a signal charge corresponding to the intensity of an incoming light beam is stored in the photodiodes 1a to 1e only during the interval S.

The stored signal charge is transferred to the signal-readout section 2 at a time $t_2$ at which the succeeding transfer pulse of FIG. 2A is received. The regions under the electrodes 5a to 5e impressed with a D.C. voltage of FIG. 2D have a low potential barrier. In contrast, the electrodes 3a to 3e are impressed with a voltage of 0V at times other than that at which the signal charge transfer pulse of FIG. 2A is generated. Accordingly, the regions under these electrodes 3a to 3e have a high potential barrier. When, therefore, a signal charge being stored in the photodiodes 1a to 1e during the intergration interval S exceeds a prescribed amount, then said excess portion of a charge flows into the overflow drain section 4 through the regions under the electrodes 5a to 5e to be drawn off to the outside. Thus, a surplus charge produced in a photosensing region which exceeds a prescribed amount is prevented from flowing into an adjacent picture element region or signal-readout section 2, thereby reducing the possibility of the blooming phenomenon being produced. The prior art charge transfer image sensor is indeed effective to minimize the blooming phenomenon, where intense light beams are brought to part of the photo-sensing subsection 1. But if the whole photosensing subsection 1 of the prior art image sensor is exposed to intense light beams, then the photosensing regions are saturated alike, preventing the signal-readout section 2 from producing a good video signal. If, in such case, the integration interval S is shortened, then it is possible to generate a good video signal. However, the shortening of the interval S means the compression of a time base indicated in FIG. 2A. In the above-mentioned case, the time base of the signals of FIGS. 2B, 2C and 2E has to be compressed. This is tantamount to the fact that elements of the driving circuit of an image sensor and a signal-processing circuit are demanded to be the type of high speed operation and consequently high cost, and moreover power consumption is increased.

Where the overflow gate subsection 5 of the prior art image sensor of FIG. 1 is supplied with a pulse ahead of the pulse of FIG. 2A instead of a D.C. voltage, then the period during which the image sensor displays effective photosensitivity can be shortened without increasing the frequency of a clock signal used. The reason is that when a pulse is supplied to the overflow gate subsection 5, a charge stored in the photosensing subsection 1 up to this point is drawn off to the drain section 4. According to this process, however, a signal charge retained in the photodiodes are governed by the voltage of a pulse impressed on the overflow gate subsection 5 and signal charge transfer gate subsection 3, presenting difficulties in producing a good video signal.

It is accordingly an object of this invention to provide a charge transfer image sensor which produces a good video signal regardless of the intensity of light beams irradiated on the photosensing subsection.

Another object of the invention is to provide a charge transfer image sensor which produces a good video signal without increasing the frequency of pulses supplied to the driving circuit and signal-processing circuit over the case of the prior art image sensor.

SUMMARY OF THE INVENTION

The charge transfer image sensor of this invention comprises a signal-readout section for receiving a group of signal charge packets and sending forth an image signal; an overflow drain section; and a signal charge packet-forming section which is disposed between the signal-readout section and overflow drain section, includes a plurality of unit charge packet-forming regions and supplies a group of unit signal charge packets to the signal-readout section. The unit signal charge-forming section comprises a photosensing region for producing a signal charge corresponding to the intensity of an incoming light; a first barrier gate electrode and overflow gate region arranged in series between the photosensing region and overflow drain section; and a second barrier gate electrode and signal charge packet transfer gate electrode provided in series between the photosensing region and an input of the signal-readout section. The signal charge packet transfer gate electrode is impressed with a voltage having first or second levels. The overflow gate electrode is impressed with a voltage having a third or fourth level. The first and second barrier gate electrodes are each simultaneously impressed with a voltage having a fifth level so as to form potential barriers of equal height at the semiconductor regions under the respective barrier gate electrodes. The overflow drain section is supplied with a voltage having a sixth level.

BRIEF DESCRIPTION OF THE DRAWING

FIG. 1 is a plan view of the prior art charge transfer image sensor;

FIGS. 2A to 2E show the waveforms of signals at respective sections of the image sensor of FIG. 1;

FIG. 3A is a plan view of an image sensor according to one embodiment of this invention;

FIGS. 4A to 4G show the waveforms of signals at respective sections of the image sensor of FIG. 3A;

DETAILED DESCRIPTION OF THE PREFERRED EMBODIMENTS

Figure 3B:
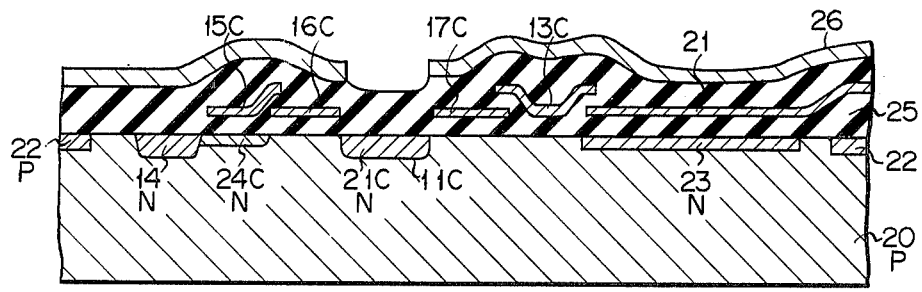
FIG. 3B is a sectional view on line 3B—3B of a section of FIG. 3A enclosed in broken lines.

FIG. 3A shows the schematic arrangement of a charge transfer image sensor embodying this invention which comprises, for example, five picture elements. Reference numeral 11 denotes a photosensing subsection comprising five photosensing regions provided with photodiodes 11a to 11e respectively. Reference numeral 12 shows a signal-readout section (shift register) of a 2-phase drive type which produces a video signal $O_1$. Pulses for 2-phase driving are provided from the terminals 6a, 6b. Reference numeral 14 denotes a drain section, and reference numeral 15 shows an overflow gate subsection comprising five overflow gate regions, provided with electrodes 15a to 15e respectively. A first barrier gate subsection 16 includes five first barrier gate regions provided with gates 16a to 16e respectively. A second barrier gate subsection 17 is formed of five second barrier gate regions provided with gates 17a to 17e. A signal charge transfer gate subsection 13 consists of five signal charge transfer gate regions provided with electrodes 13a to 13e. The above-mentioned subsections and sections are integrated on a semiconductor substrate 20 of P conductivity type, for example. A portion 18 enclosed in broken lines corresponds to a unit picture signal.

Figure 3C:
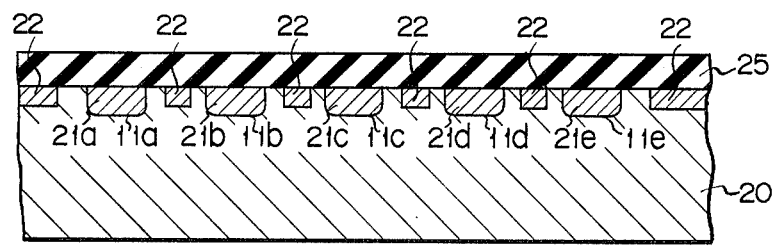
FIG. 3C is a sectional view on line 3C—3C of FIG. 3A.

Referring to FIG. 3B showing a sectional view on line 3B—3B of FIG. 3A, there are formed on the P type semiconductor substrate 20 an N type drain region 14; a region 24C doped with an N type impurity, for example, by ion implantation at a low concentration; a N type island region 21C constituting a photodiode 11C; an N type region 23 used as a bulk channel; a P type channel stopper region 22 for separating one picture element region from the others; and an insulating layer 25 of $SiO_2$. With this insulating layer 25 taken as a border line, there are formed a gate electrode 15C facing the N type region 24C; a gate electrode 16C facing that portion of the surface of the P type semiconductor substrate 20 which is defined between the region 24C and region 21C; an electrode 17C facing that portion of the surface of the P type semiconductor substrate 20 which is defined between the region 21C and region 23 at a point drawn nearer to said region 21C; an electrode 13C facing that portion of the surface of the P type semiconductor substrate 20 which is defined between the region 21C and region 23 at a point drawn nearer to the region 23; and a signal charge transfer electrode 21 included in the shift register 12 and disposed to face the region 23. The electrodes are made of polysilicone. An aluminium light shield 26 is thermally deposited on the insulating layer 25. A photodiode 11C is formed at a junction between the region 21C and the semiconductor substrate 20. As seen from FIG. 3C, a channel stopper region 22 is provided between the respective adjacent picture element regions.

FIGS. 4A to 4F show the waveforms of driving pulses supplied to the respective sections or respective subsections of FIG. 3A. FIG. 4G indicates the waveform of an output $O_1$ from the shift register 12. The input terminal 7e (FIG. 3A) of the signal charge transfer image sensor of this invention is supplied with signal charge packet transfer pulses 8a, 8b ... of FIG. 4A. A reference numeral $S_1$ expresses a time interval between the first and second signal charge packet transfer pulses 8a, 8b, ..., that is, an integration period during which light beams are received. The pulses have first and second voltage levels $V_1$, $V_2$. The terminal 7b of the subject image sensor is supplied with overflow pulses 9a, 9b, ... A time interval between signal charge packet transfer pulses 9a, 9b has the same duration as $S_1$. However, the pulse 9b, for example, is issued ahead of the pulse 8b by the interval of $S_2$, and has third and fourth voltage levels $V_3$, $V_4$. The terminals 7c, 7d of the subject image sensor are supplied with D.C. voltage of FIG. 4C having a fifth voltage level $V_5$. The terminal 7a is supplied with D.C. voltage of FIG. 4D having a sixth voltage level $V_6$. $V_5$ is lower than $V_1$ $V_3$ and $V_6$ is higher than $V_1$. The terminal 6a is supplied with signal charge packet transfer clock pulses of FIG. 4E having, for example, a high voltage level $V_1$ and low voltage level $V_2$. The terminal 6b is supplied with signal charge packet transfer clock pulses of FIG. 4F having, for example, a high voltage level $V_1$ and low voltage level $V_2$. FIG. 4G shows the waveform of an output $O_1$ from the shift register 12. An output signal produced during one scanning period of the shift register 12 is expressed as $O_1$. The interval $S_2$ shown in FIGS. 4A and 4B may be controlled manually, or automatically to cause the voltage level of the output $O_1$ to fall within the prescribed range, or in accordance with the level of an output signal from a separately provided sensor for detecting the intensity of an incoming light. For convenience of description, a time interval arrived at by subtracting the interval $S_2$ from the interval $S_1$ is referred to as "a first integration period". The interval $S_2$ is referred to as "a second integration period".

There will now be described by reference to FIGS. 4A to 4G and FIGS. 5A to 5G the operation of a charge transfer image sensor of FIG. 3A embodying this invention. As apparent from FIGS. 4A and 4B, signal charges integrated by the photosensing regions are conducted to the drain section 14 when the overflow gate pulse 9b is generated. During the interval $S_2$, signal charges produced in the photosensing regions are transferred to the shift register, making it unnecessary to shorten the integrated interval $S_1$.

Figure 5A:
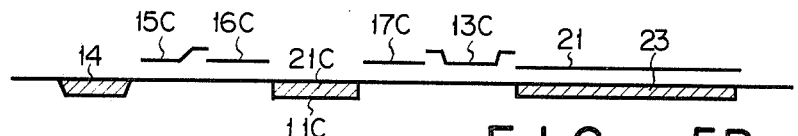
FIGS. 5A to 5G illustrate the operation of the image sensor of FIG. 3A.
Figure 5B:
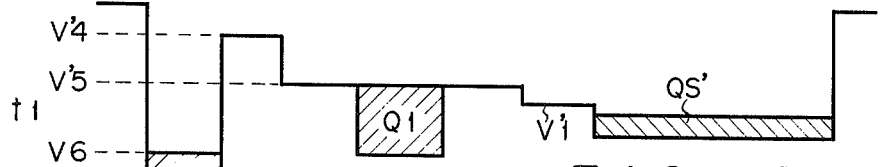
Figure 5C:
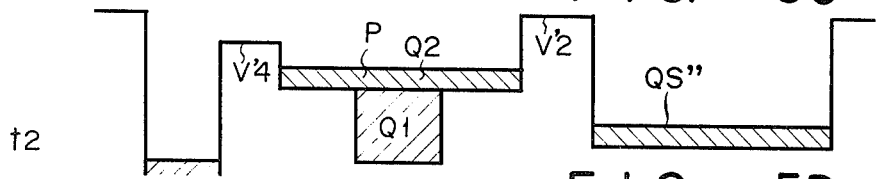
Figure 5D:
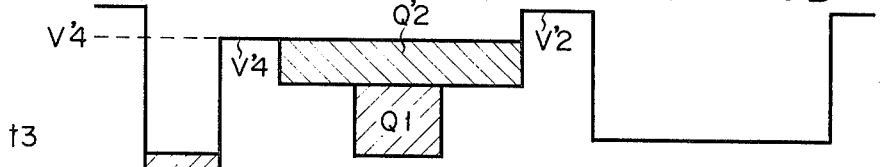
Figure 5E:
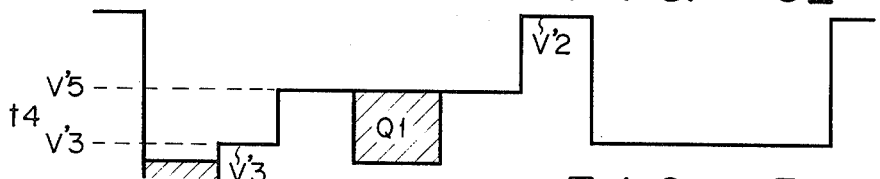
Figure 5F:
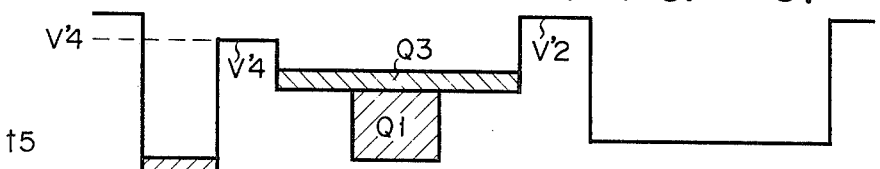
Figure 5G:
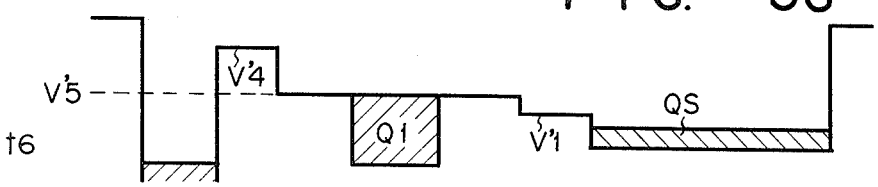

FIG. 5A shows the relative positions of the electrodes and semiconductor regions shown in FIG. 3B. FIGS. 5B to 5G indicate the distribution of potentials in those portions of the semiconductor substrate 20 which lie under the respective electrodes and semiconductor regions and the state in which charges are stored therein, $V_3'$ and $V_4'$ show the potentials in those portions of the semiconductor substrate 20 which lie under the respective electrodes when the overflow electrode 15C is impressed with voltages having levels $V_3$ and $V_4$. $V_5'$ indicates the potentials in those portions of the semiconductor substrate 20 which lie under the electrodes 16C, 17C when they are impressed with a voltage having a level $V_5$. $V_1'$ and $V_2'$ represent the potentials in that portion of the semiconductor substrate 20 which lies under the electrode 13C when it is supplied with voltages having levels $V_1$, $V_2$. The terminals 7a, 7c, 7d are always impressed with a voltage having a prescribed level, causing the potentials on the surface of the corresponding semiconductor regions to have a prescribed levels expressed as $V_6$, $V_5'$, $V_5'$. FIG. 5B illustrates the distribution of surface potentials and the state in which charges are stored at point of time $t_1$ of FIG. 4. A signal charge $Q_s'$ is transferred to that portion of the surface of the semiconductor substrate 20 which lies under the signal charge transfer electrode 21. A charge $Q_1$ having a prescribed amount is retained in the photodiode 11C. As seen from FIG. 5B, that portion of the surface of the semiconductor substrate 20 which lies under the overflow electrode 15C has a potential level $V_4'$ and that portion of the surface of the semiconductor substrate 20 which lies under the electrode 13C has a potential level $V_1'$, namely, a transfer gate region including the electrode 13C is rendered conducting. The charge $Q_1$ is stored in a depletion layer capacitor of the photodiode 11C. In other words, the photodiode 11C may be regarded as a well P having a high potential. This well can store the signal charge $Q_1$ due to the presence of a potential barrier $V_5'$. At point of time $t_2$, a voltage impressed on the terminal 7e (electrode 13C) has a second level $V_2$, namely, the substrate surface under the electrode 13C has a potential $V_2'$. Consequently, those portions of the semiconductor substrate 20 which lie under the electrodes 16C, 17C and the potential well P of the photodiode 11C are successively supplied with a charge $Q_2$. The charge $Q_2$ is a charge produced in a photosensing region by irradiation of a preceding light beam. FIG. 5D shows the distribution of potentials and the state in which a charge is stored at point of time $t_3$. Namely, FIG. 5D indicates that charges successively stored in the potential well P are partly drawn off over the potential barrier $V_4'$, and only those portions of the stored charges whose flow is stopped by the potential barrier $V_4'$ are retained in the potential well P. The charge $Q_2'$ denotes that which is progressively stored, as the first integration interval (FIG. 4) passes. FIG. 5D shows the state in which charges are stored at point of time $t_3$, namely, that a charge exceeding a prescribed amount of charge $Q_2'$ is continuously drawn off to the drain section 14. FIG. 5E shows the state in which charges are stored at point of time $t_4$. At this point of time $t_4$, the overflow electrode 15C is supplied with the overflow pulse 9b. Namely, the potential in that portion of the surface of the semiconductor substrate 20 which lies under the overflow electrode 15C changes from $V_4'$ (FIG. 5D) to $V_3'$. Therefore, a charge $Q_2'$ (FIG. 5D) is all drawn off to the drain section 14, causing only the prescribed amount of charge $Q_1$ to be retained in the photodiode 11C. FIG. 5E shows that charges (except for $Q_1$) which are generated in the photosensing region during the first integration period ($S_1$–$S_2$) of FIG. 4A is all discharged to the drain section 14. FIG. 5F indicates the state in which charges are stored at point of time $t_5$. At this point of time $t_5$, the voltage impressed on the overflow electrode 15C has its level changed from $V_3$ to $V_4$. As a result, the potential of the surface of the semiconductor region corresponding to the overflow electrode 15C is changed from $V_3'$ to $V_4'$. Since this potential $V_4'$ acts as a potential barrier, the barrier regions including the electrodes 16C, 17C and diode 11C are supplied with a new charge $Q_3$. This new change $Q_3$ begins to be stored when the lagging edge of the overflow pulse 9b arrives. At point of time $t_6$, a voltage impressed on the electrode 13C has its level changed from $V_2$ to $V_1$ as shown in FIG. 5G, causing the potential of the surface of a semiconductor region corresponding to the electrode 13C to be changed from $V_2'$ (FIG. 5F) to $V_1'$. Accordingly, new charges $Q_3$ stored in the semiconductor regions lying under the electrodes 16C, 17C and also in the photodiode 11C during the integration interval $S_2$ are transferred as signal charges $Q_s$ to a semiconductor region lying under the transfer electrode 21, causing a prescribed amount of charge $Q_1$ to be retained in the photodiode 11C. With respect to the other picture element regions including the photodiodes 11a, 11b, 11d, 11e, signal charges are produced and transferred in the same manner as described above. As apparent from FIG. 5D, an excess amount of change produced in a photosensing region when receipt of an intense light during the first integration interval ($S_1$–$S_2$) is drawn off to the drain section 14 over the potential barrier having a level $V_4'$ which is formed on the surface of a semiconductor region lying under the overflow electrode 15C. Therefore, an output signal $O_1$ of FIG. 4G is prevented from being obstructed due to the possible leakage of the excess signal charge to the adjacent picture element regions and shift register 12. A prescribed amount of charge $Q_1$ to be always retained in the photodiode 11C is defined by the level of a voltage $V_5$ impressed on the electrodes 16C, 17C. The fact that an amount of signal charge $Q_1$ is always set to a prescribed level means that an amount of charge stored only during the integration interval $S_2$ is transferred to a region lying under the transfer electrode 21. This bears a very great significance. The fact that an amount of charge $Q_1$ is only defined by the potential barrier $V_5'$ of the semiconductor regions lying under the electrodes 16C, 17C means that the charge $Q_1$ always remains unchanged regardless of some fluctuations in the level $V_1$ of signal charge packet transfer pulses 8a, 8b . . . and the level $V_3$ of overflow pulses 9a, 9b . . . . Since the charge $Q_1$ always remains invariable, a signal charge corresponding to an incoming light having a low intensity is unfailingly conducted to a semiconductor region lying under the transfer electrode 21, thus broadening the dynamic range of an incoming light. Since, as previously described, it is unnecessary to change the frequency of pulses supplied to an image sensor in accordance with the intensity of an incoming light, adjustment of the sensor driving circuit is not required. What is needed is only to control the integration interval $S_2$ as occasion arises.

Provision of the semiconductor region 24C of FIG. 3B allows the semiconductor region lying under the electrode 15C to have a lower threshold voltage than a semiconductor region lying under the electrode 13C. Even where, therefore, the second level $V_2$ of a voltage inpressed on the transfer gate subsection 13 is made equal to the fourth level $V_4$ of a voltage impressed on the overflow gate subsection 15, that is, both voltages $V_2$, $V_4$ are set to the zero volt, the blooming phenomenon can be suppressed, thus simplifying the arrangement of an image sensor-driving circuit. Further, a signal charge can also be stored in the semiconductor regions lying under the electrodes 16C, 17C. Thus, an increased amount of signal charge can be stored in a photosensing region, broadening the dynamic range of an incoming light.

Referring to FIG. 3B, the threshold voltage of a semiconductor regions lying the overflow electrode 15C was defined by controlling the concentration at which the surface of the region was doped with an impurity. To this and, it is obviously possible to control the thickness of an insulating layer deposited between the overflow electrode 15C and semiconductor substrate 20 or control an amount of charge stored in the insulating layer.

FIG. 3A shows the photodiodes 11a to 11e arranged to obtain data on one direction of a foreground subject. Obviously it is possible to arrange the photdiodes to obtain data on two directions of the foreground subject. The shift register shown in FIG. 3A is a 2-phase, n-bulk channel charge coupled type. However, a single shift register need not be restrictively used, but a plurality thereof may be applied. Further, the shift register may be of the single phase, 3-phase or 4-phase driving type instead of the aforesaid 2-phase driving type.

Figure 6B:
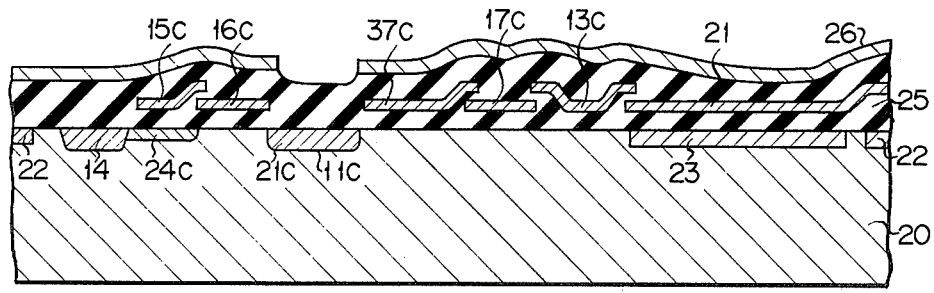
FIG. 6B is a sectional view on line 6B—6B of FIG. 6A.
Figure 7:
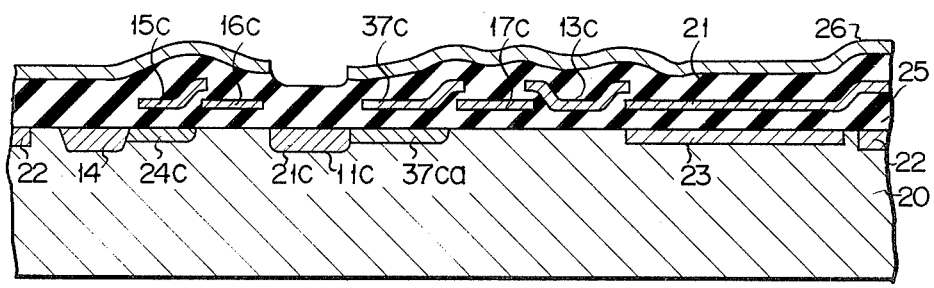
FIG. 7 is a sectional view of an image sensor according to still another embodiment of the invention which corresponds to the sectional view of FIG. 6B.
Figure 6A:
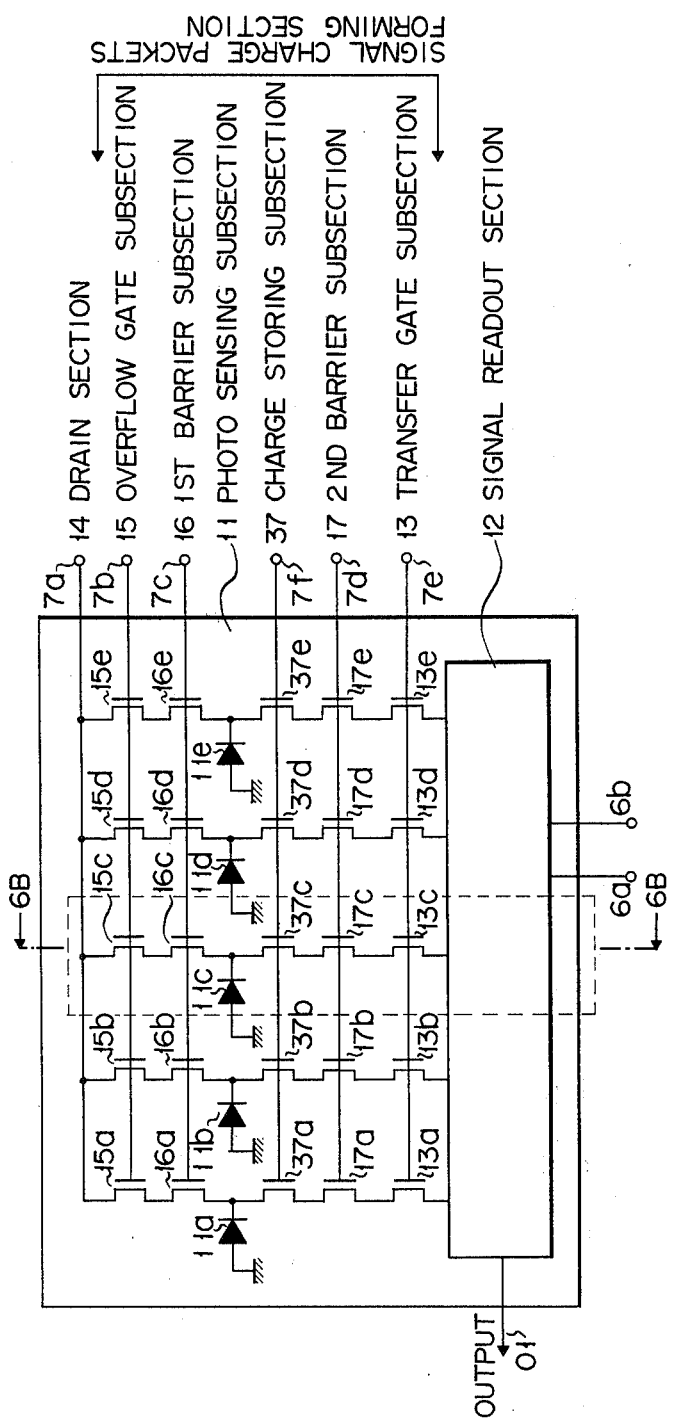
FIG. 6A is a plan view of an image sensor according to another embodiment of the invention.

There will now be described by reference to FIGS. 6A and 6B a charge transfer image sensor according to another embodiment of this invention. According to this embodiment, a charge-storing subsection 37 is provided between a photosensing subsection 11 and a second barrier subsection 17. This charge-storing subsection 37 may be disposed between the photosensing subsection 11 and a first barrier subsection 16. Further, it is possible to provide the charge-storing subsection 37 between the photosensing subsection 11 and first barrier subsection 16 and also between the photosensing subsection 11 and second barrier subsection 17. The charge-storing subsection 37 comprises five regions provided with electrodes 37a to 37e respectively. These electrodes 37a to 37e are impressed with D.C. voltage from a terminal 7f. FIG. 6B shows a sectional view on line 6B—6B of FIG. 6A. A semiconductor region lying under the electrode 37C constitutes a channel region of the surface channel type. However, it is possible to provide, as shown in FIG. 7, a N-bulk channel region 37ca under the electrode 37C in order to increase a charge storing capacity.

What is claimed is:

1. A charge transfer image sensor which comprises a signal-readout section for receiving a group of signal charge packets and sending forth an image signal; an overflow drain section; and a signal charge packet-forming section which is disposed between the signal-readout section and overflow drain section, includes a plurality of unit signal charge packet-forming regions and supplies a group of unit signal charge packets to the signal-readout section, and wherein the unit signal charge packet-forming section includes a photosensing region for producing a charge corresponding to the intensity of an incoming light, a first barrier gate electrode and overflow gate electrode arranged in series between the photosensing region and overflow drain section, and a second barrier gate electrode and signal charge packet transfer gate electrode provided in series between the photosensing region and an input of the signal-readout section; the signal charge packet transfer gate electrode is impressed with a voltage having a first or second level; the overflow gate electrode is impressed with a voltage having a third or fourth level; the first and second barrier gate electrodes are each impressed with a constant voltage so as to form potential barriers of equal height at the semiconductor regions under the respective barrier gate electrodes; and the overflow drain section is supplied with a voltage having a sixth level.

2. The charge transfer image sensor according to claim 1, wherein during the operation of the image sensor, the photosensing region is stored with a prescribed amount of charge defined by a voltage having a fifth level which is impressed on the first and second barrier gate electrodes; the semiconductor regions under the first and second barrier gate electrodes and photosensing region are stored with a first variable charge and an excess of the first variable charge over a prescribed amount is drawn off to the overflow drain section, while the signal charge transfer gate electrode receives the voltage having the second level; the prescribed amount of the first variable charge is drawn off to the overflow drain section, when the overflow gate electrode is impressed with the voltage having the third level; the semiconductor regions under the first and second barrier gate electrodes and photosensing region are stored with a second variable charge, when the overflow gate electrode is again impressed with the voltage having the fourth level; and the second variable charge is transferred to the signal-readout section, when the signal charge packet transfer gate electrode is impressed with the voltage having the first level.

3. The charge transfer image sensor according to claim 1, wherein the photosensing region includes a photodiode made of a semiconductor region of a second conductivity type on the surface of a semiconductor substrate of a first conductivity type.

4. The charge transfer image sensor according to claim 1, wherein the smiconductor region under the overflow gate electrode has a lower threshold voltage than that of the semiconductor region under the signal charge packet transfer gate electrode.

5. The charge transfer image sensor according to claim 1, wherein each of the sections is formed on a semiconductor substrate of a first conductivity types and the surface of a semiconductor region included in the overflow gate subsection is made to have a second conductivity type.

6. The charge transfer image sensor according to claim 1, wherein the voltage of the second level impressed on the signal charge packet transfer gate electrode is made to have the same value as the voltage of the fourth level impressed on the the overflow gate electrode.

7. The charge transfer image sensor according to claim 1, wherein the signal-readout section is a shift register formed of a charge-coupled device (CCD).

8. The charge transfer image sensor according to claim 1, wherein a charge-storing region provided with a control electrode is formed in at least one of the spaces defined between the photosensing region and the semiconductor region under the first barrier gate electrode, and also between the photosensing region and the semiconductor region under the second barrier gate electrode.

9. A charge transfer image sensor which comprises a signal-readout section for receiving a group of signal charge packets and sending forth an image signal; an overflow drain section; and a signal charge packet-forming section which is disposed between the signal-readout section and overflow drain section, includes a plurality of unit signal charge packet-forming regions and supplies a group of unit signal charge packets to the signal-readout section, and wherein the unit signal charge packet-forming section includes a photosensing region for producing a charge corresponding to the intensity of an incoming light, a first barrier gate electrode and overflow gate electrode arranged in series between the photosensing region and overflow drain section, and a second barrier gate electrode and signal charge packet transfer gate electrode provided in series between the photosensing region and an input of the signal-readout section; said first barrier gate electrode, said overflow gate electrode, said second barrier gate electrode, and said signal charge packet transfer gate electrode all being electrically and physically separate from each other; the signal charge packet transfer gate electrode is impressed with a voltage having a first or a second level; the overflow gate electrode is impressed with a voltage having a third or fourth level; the first and second barrier gate electrodes are each impressed with a constant voltage so as to form potential barriers of equal height in semiconductor regions located under the respective barrier gate electrodes; and the overflow drain section is supplied with a voltage having a sixth level.

* * * * *